United States Patent
Lin

(10) Patent No.: US 11,264,269 B1
(45) Date of Patent: Mar. 1, 2022

(54) METHOD OF MANUFACTURING TRENCH TYPE SEMICONDUCTOR DEVICE

(71) Applicant: Advanced Power Electronics Corp., Hsinchu County (TW)

(72) Inventor: Jau-Yan Lin, Hsinchu County (TW)

(73) Assignee: Advanced Power Electronics Corp., Hsinchu (TW)

( * ) Notice: Subject to any disclaimer, the term of this patent is extended or adjusted under 35 U.S.C. 154(b) by 0 days.

(21) Appl. No.: 17/093,586

(22) Filed: Nov. 9, 2020

(30) Foreign Application Priority Data

Sep. 1, 2020 (TW) .................................. 109129904

(51) Int. Cl.
*H01L 21/762* (2006.01)
*H01L 29/423* (2006.01)

(52) U.S. Cl.
CPC .. *H01L 21/76224* (2013.01); *H01L 21/76205* (2013.01); *H01L 29/4236* (2013.01)

(58) Field of Classification Search
CPC ........... H01L 21/76224; H01L 29/4236; H01L 21/76205
See application file for complete search history.

(56) References Cited

U.S. PATENT DOCUMENTS

| | | | | |
|---|---|---|---|---|
| 2012/0276703 | A1* | 11/2012 | Grivna | H01L 29/66719 438/270 |
| 2019/0006479 | A1* | 1/2019 | Hsu | H01L 29/42376 |
| 2019/0006489 | A1* | 1/2019 | Hsu | H01L 29/407 |
| 2019/0378902 | A1* | 12/2019 | Chen | H01L 29/7813 |
| 2020/0044078 | A1* | 2/2020 | Yilmaz | H01L 29/66719 |
| 2020/0266294 | A1* | 8/2020 | Okumura | H01L 29/36 |
| 2020/0403069 | A1* | 12/2020 | Kimoto | H01L 29/42368 |

FOREIGN PATENT DOCUMENTS

| | | |
|---|---|---|
| TW | 201733112 A | 9/2017 |
| TW | 201906078 A | 2/2019 |
| TW | 201906164 A | 2/2019 |

\* cited by examiner

*Primary Examiner* — Julia Slutsker
(74) *Attorney, Agent, or Firm* — CKC & Partners Co., LLC

(57) ABSTRACT

A method of manufacturing a trench type semiconductor device includes the following steps. First, an epitaxial layer is formed on a substrate, then a trench is formed in the epitaxial layer, and a gate structure is formed in the trench. The gate structure includes an upper gate and a lower gate, and an intermediate insulating portion, and the intermediate insulating portion is located in the upper gate.

6 Claims, 8 Drawing Sheets

METHOD OF MANUFACTURING TRENCH TYPE SEMICONDUCTOR DEVICE

RELATED APPLICATIONS

This application claims priority to Taiwan Application Serial Number 109129904, filed Sep. 1, 2020, which is herein incorporated by reference.

TECHNICAL FIELD

The present disclosure generally relates to a method of manufacturing a semiconductor device. More particularly, the present disclosure relates to a method of manufacturing a trench type semiconductor device.

BACKGROUND

The power metal oxide semiconductor field effect transistor (power MOSFET), also referred to as power transistor, is currently widely used in analog circuits and digital circuits. The power transistor has very low on-state resistance and has the advantage of very fast switching speed, so that the power transistor has become the mainstream of power components.

The power transistors can be classified according to the current flowing path thereof. The current flowing path in parallel on the surface of the element is called the horizontal type, and the current flowing path vertically is called the vertical type. The drain of the vertical power transistor is located at the bottom thereof, so that the resistance per unit area of the chip can be reduced.

In addition, a trench-type gate power transistor can effectively reduce on-state resistance and therefore becomes the mainstream of high-frequency and low-voltage power components. For the power components, the reductions of the on-state resistance and gate capacitance are effectively to improve the response speed of the power components so as to improve product quality thereof.

SUMMARY

One objective of the embodiments of the present invention is to provide a method of manufacturing a trench type semiconductor device able to reduce the input capacitance and the reverse transfer capacitance of the semiconductor device and increase the output capacitance of the semiconductor device so as to improve the gate capacitance characteristics and the gate response speed of the semiconductor device.

To achieve these and other advantages and in accordance with the objective of the embodiments of the present invention, as the embodiment broadly describes herein, the embodiments of the present invention provides a method of manufacturing a trench type semiconductor device including the following steps. First, an epitaxial layer is formed on a substrate, then a trench is formed in the epitaxial layer, and a gate structure is formed in the trench. The gate structure includes an upper gate and a lower gate, and an intermediate insulating portion, and the intermediate insulating portion is located in the upper gate.

In some embodiments, the method of manufacturing a trench type semiconductor device further includes a step of depositing a first oxide layer in the trench and a step of depositing a first polysilicon layer on the first oxide layer and in the trench.

In some embodiments, a thickness of the first oxide layer is about 5000 angstroms (Å) to 10000 angstroms, and a thickness of the first polysilicon layer is about 6000 angstroms to 10000 angstroms and fills up the trench.

In some embodiments, the method of manufacturing a trench type semiconductor device further includes a step of etching back the first polysilicon layer until lower than an upper surface of the first oxide layer about 1.5 microns to 2 microns.

In some embodiments, the method of manufacturing a trench type semiconductor device further includes a step of oxidizing a surface of the first polysilicon layer to form a second oxide layer, and a step of enclosing the lower gate by the second oxide layer and the first oxide layer.

In some embodiments, the method of manufacturing a trench type semiconductor device further includes a step of depositing a silicon nitride layer in the trench, a step of etching back the silicon nitride layer to form the intermediate insulating portion, and a step of etching back the first oxide layer to remove a portion of the first oxide layer to form a first dielectric layer and expose a partial surface of the epitaxial layer, and the first dielectric layer and the second oxide layer enclose the lower gate.

In some embodiments, the method of manufacturing a trench type semiconductor device further includes a step of oxidizing the partial surface of the epitaxial layer to form a gate oxide layer.

In some embodiments, the method of manufacturing a trench type semiconductor device further includes a step of depositing a second polysilicon layer to fill up the trench, and a step of etching back the second polysilicon layer until lower than an upper surface of the gate oxide layer about 200 angstroms to 500 angstroms.

In some embodiments, the method of manufacturing a trench type semiconductor device further includes a step of implanting ions into the epitaxial layer and driving in the ions by heating, and a step of utilizing a source mask to define a source region.

In some embodiments, the method of manufacturing a trench type semiconductor device further includes a step of forming a second dielectric layer on the gate oxide layer, a step of etching the second dielectric layer and the gate oxide layer with a contact mask to form a plurality of openings, and a step of depositing a metal layer on the second dielectric layer and in the openings.

Hence, the method of manufacturing a trench type semiconductor device can produce a power transistor, the volume of the upper gate is effectively reduced by the intermediate insulating portion, the upper gate is accurately formed between the intermediate insulating portion and the gate oxide layer, and the first dielectric layer and the second oxide layer are simultaneously utilized to enclose the lower gate. Therefore, the drain-source breakdown voltage (BVDSS) is effectively increased, the input capacitance (Ciss) and the reverse transfer capacitance (Crss) are reduced and the output capacitance (Coss) is increased to improve the gate capacitance characteristics, and increase the gate response speed.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

FIGS. 1 to 8 are partial cross-sectional side structural views of a trench type semiconductor device in a manufacturing process according to an embodiment of the present invention. Referring to FIGS. 1 to 8, a method of manufacturing a trench type semiconductor device is illustrated. First, referring to FIG. 1, an epitaxial layer 120 is formed on a substrate 110, and a trench 122 is formed in the epitaxial layer 120. In some embodiments, the substrate 110 is an N-type semiconductor substrate or P-type semiconductor substrate. Taking a silicon substrate as an example, the N-type conductive impurities are pentavalent impurities, such as phosphorus or arsenic, and the P-type conductive impurities are trivalent impurities, such as boron, aluminum, or gallium.

In addition, the epitaxial layer 120 has the same conductivity type as the substrate 110, and the doping concentration of the epitaxial layer 120 is generally lower than that of the substrate 110. When the substrate 110 has a high concentration of N-type doping, and the epitaxial layer 120 may have a low concentration of N-type doping.

In some embodiments, the width of the trench 122 is about 1 to 2 microns, and the depth of the trench 122 is about 5 to 7 microns.

Figure 1:
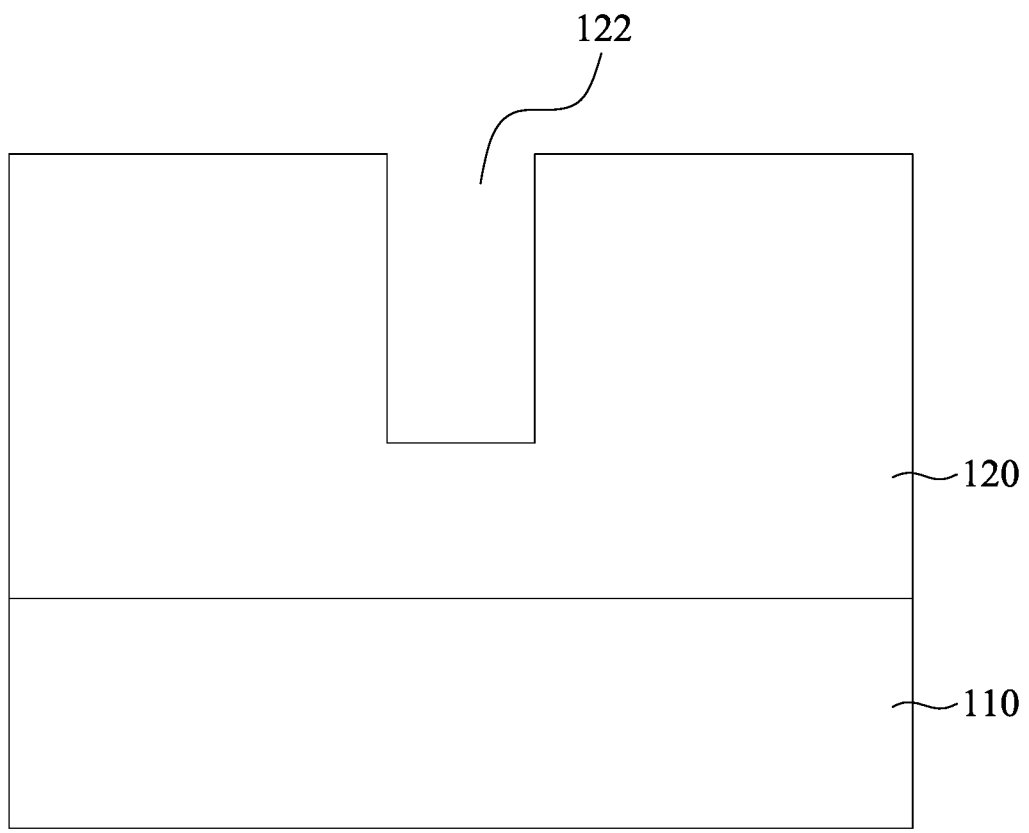
FIGS. 1 to 8 are partial cross-sectional side structural views of a trench type semiconductor device in a manufacturing process according to an embodiment of the present invention.
Figure 2:
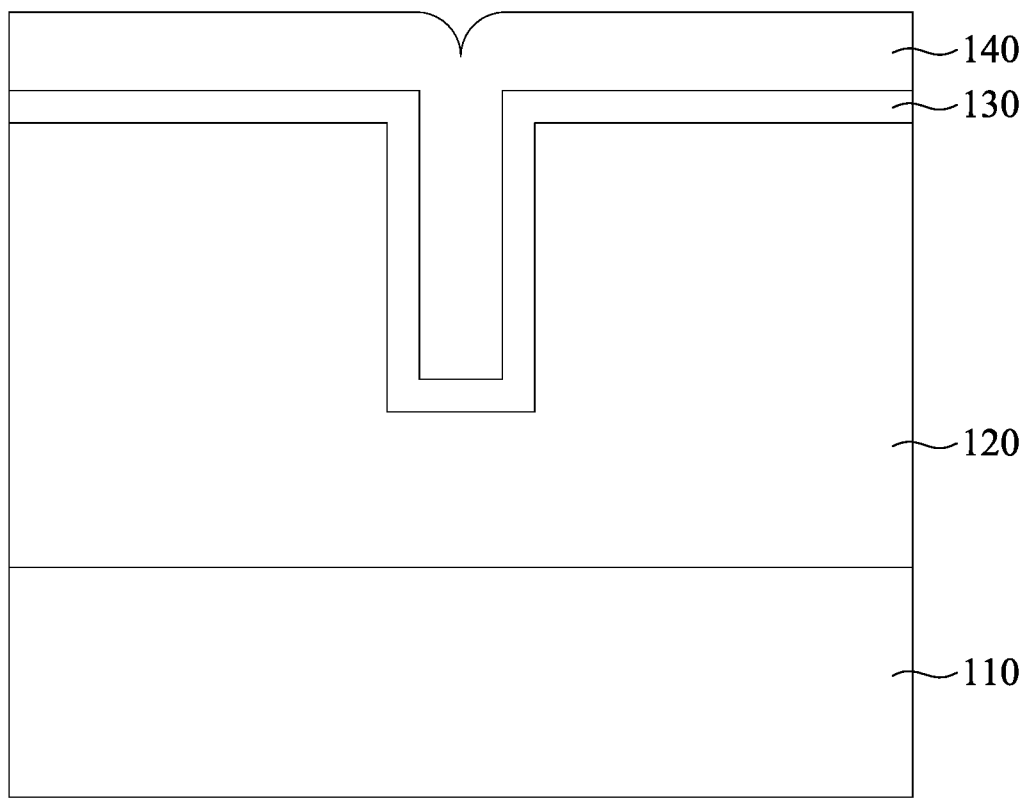

Subsequently, referring to FIG. 2, a first oxide layer 130 is deposited in the trench 122, and then a first polysilicon layer 140 is deposited on the first oxide layer 130 and in the trench 122. In some embodiments, the thickness of the first oxide layer 130 is about 5000 angstroms (Å) to 10000 angstroms, and the thickness of the first polysilicon layer 140 is about 6000 angstroms to 10000 angstroms and fills up the trench 122.

Figure 3:
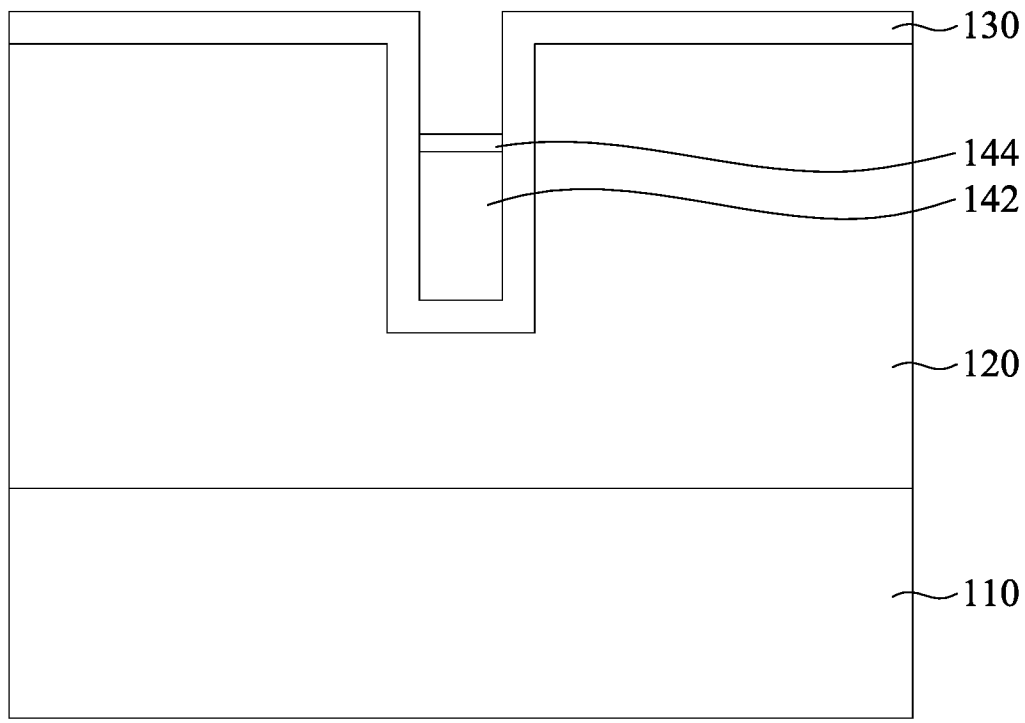

Referring to FIG. 3, the first polysilicon layer 140 is etched back to reduce the first polysilicon layer 140 until the upper surface of the first polysilicon layer 140 is lower than the upper surface of the first oxide layer 130. Afterwards, the surface of the first polysilicon layer 140 is oxidized to form a second oxide layer 144, and the second oxide layer 144 and the first oxide layer 130 fully enclose the lower gate 142, so that the lower gate 142 is sealed in the first oxide layer 130 and the second oxide layer 144. In some embodiments, the first polysilicon layer 140 is etched back to reduce the first polysilicon layer 140 until the upper surface of the first polysilicon layer 140 is lower than the upper surface of the first oxide layer 130 about 1.5 microns to 2 microns, and the thickness of the second oxide layer 144 is about 100 angstroms to 200 angstroms.

Figure 4:
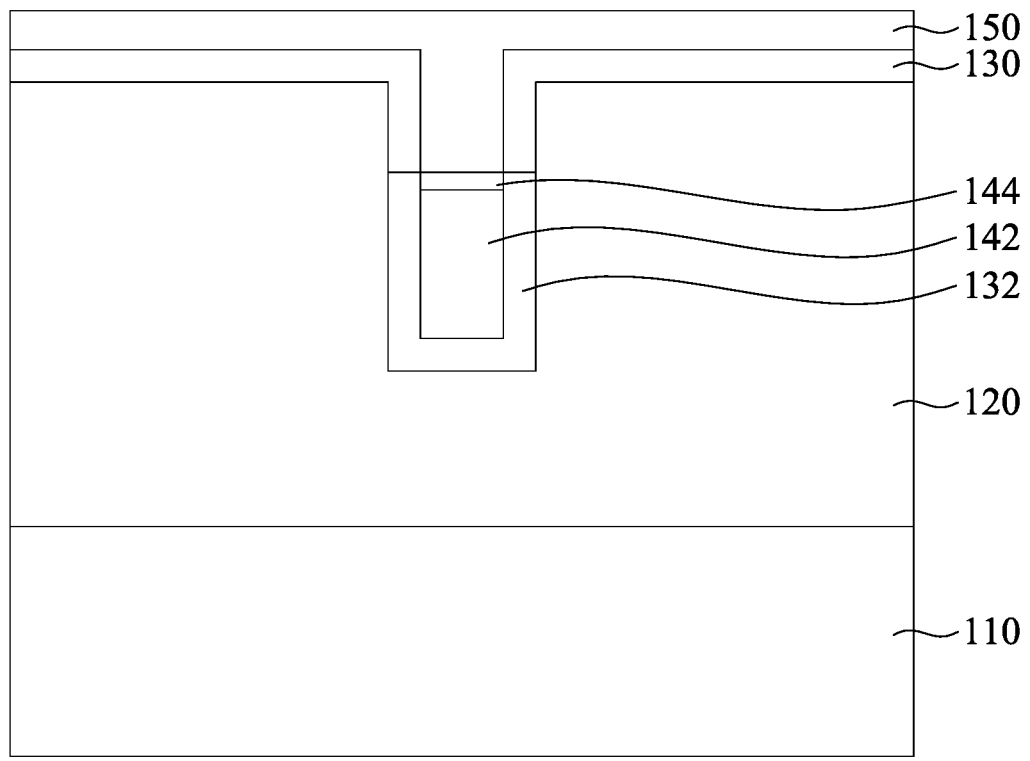
Figure 5:
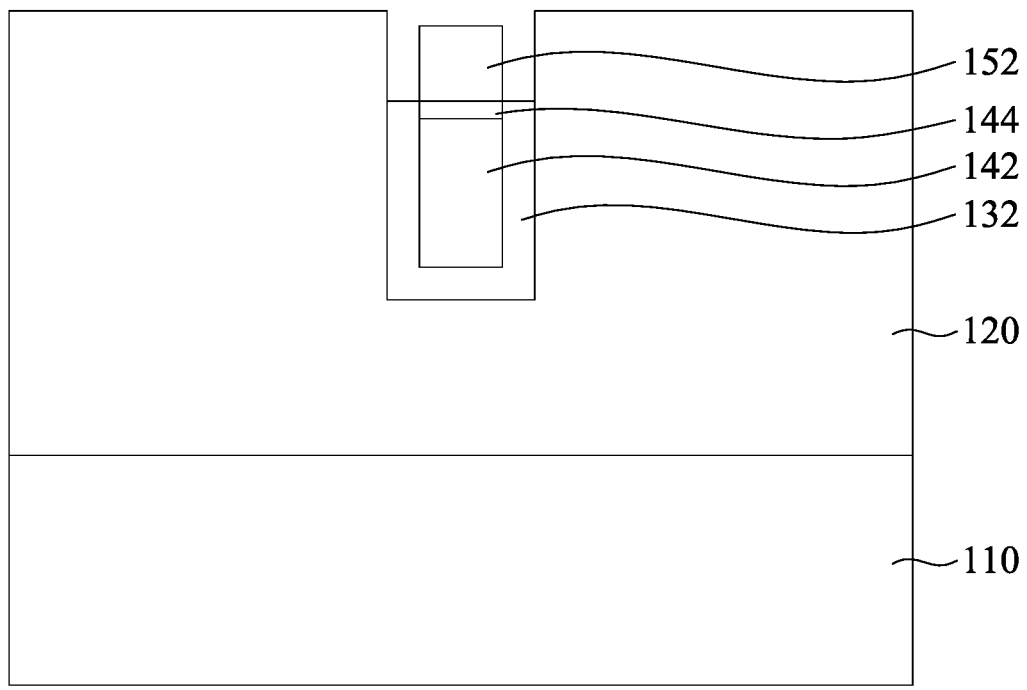

In addition, referring to FIG. 4, a silicon nitride layer 150 is deposited in the trench 122. Referring to FIG. 5, the silicon nitride layer 150 is etched back to form an intermediate insulating portion 152, and the first oxide layer 130 is etched back to remove a portion of the first oxide layer 130 so as to form a first dielectric layer 132 and expose a partial surface of the epitaxial layer 120, and the first dielectric layer 132 and the second oxide layer 144 enclose the lower gate 142.

In some embodiments, the thickness of the silicon nitride layer 150 is about 3000 angstroms to 8000 angstroms, and the upper surface of the intermediate insulating portion 152 is lower than the upper surface of the epitaxial layer 120 about 200 angstroms to 500 angstroms after the the silicon nitride layer 150 is etched back. In addition, the first oxide layer 130 is etched back to form the first dielectric layer 132 and the upper surface thereof is lower than the upper surface of the epitaxial layer 120 about 1.0 to 1.5 microns.

Figure 6:
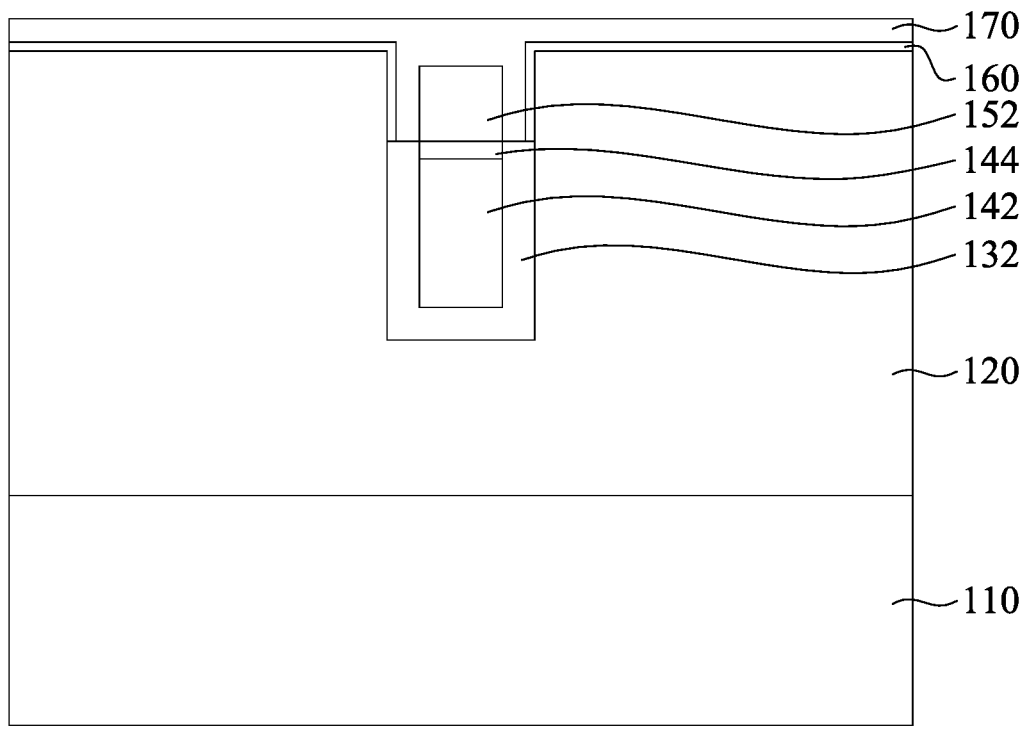

Referring to FIG. 6, the method of manufacturing a trench type semiconductor device further includes the following steps. The exposed surface of the epitaxial layer 120 is oxidized to form a gate oxide layer 160. Subsequently, a second polysilicon layer 170 is deposited to fill up the trench 122. In some embodiments, the thickness of the gate oxide layer 160 is about 500 angstroms to 1000 angstroms. The thickness of the second polysilicon layer 170 is about 3000 angstroms to 5000 angstroms to fill up the space of the trench 122.

Figure 7:
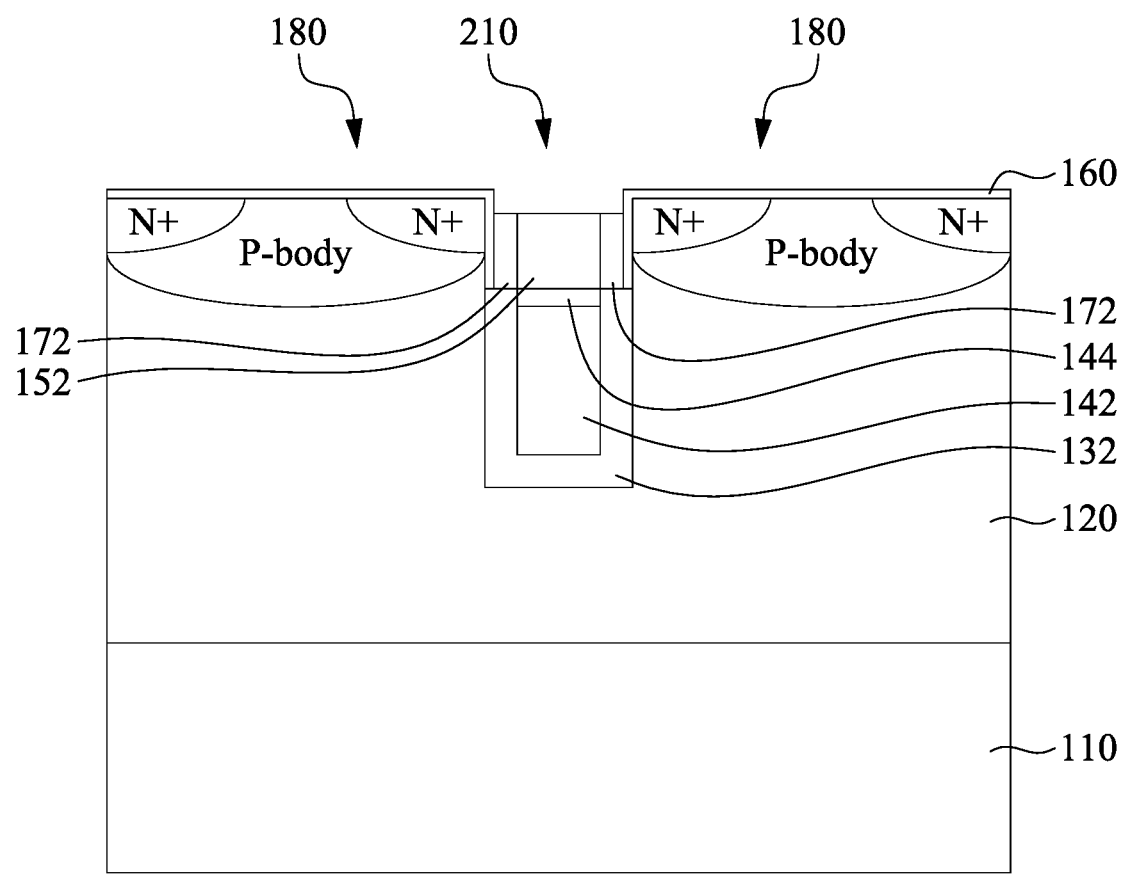

Referring to FIG. 7, the second polysilicon layer 170 is subsequently etched back until lower than the upper surface of the gate oxide layer 160 about 200 angstroms to 500 angstroms. In addition, an ion implantation is carried out. The ions are implanted into the epitaxial layer 120 around the gate structure 210 and the ions are further deeply driven in the epitaxial layer 120 by heating. In some embodiments, boron and other trivalent elements are utilized to carry out a P-type ion implantation, and then the boron and other trivalent elements are deeply driven in by heating. Subsequently, a source mask is utilized to define a source region. In some embodiments, a source mask is utilized to implant ions in the source region 180 and the ions are further driven in by heating, for example, arsenic, phosphorous, antimony and other pentavalent elements are utilized to carry out the N-type ion implantation with the source mask shielded a partial area, and then the ions are deeply driven in by heating.

Figure 8:
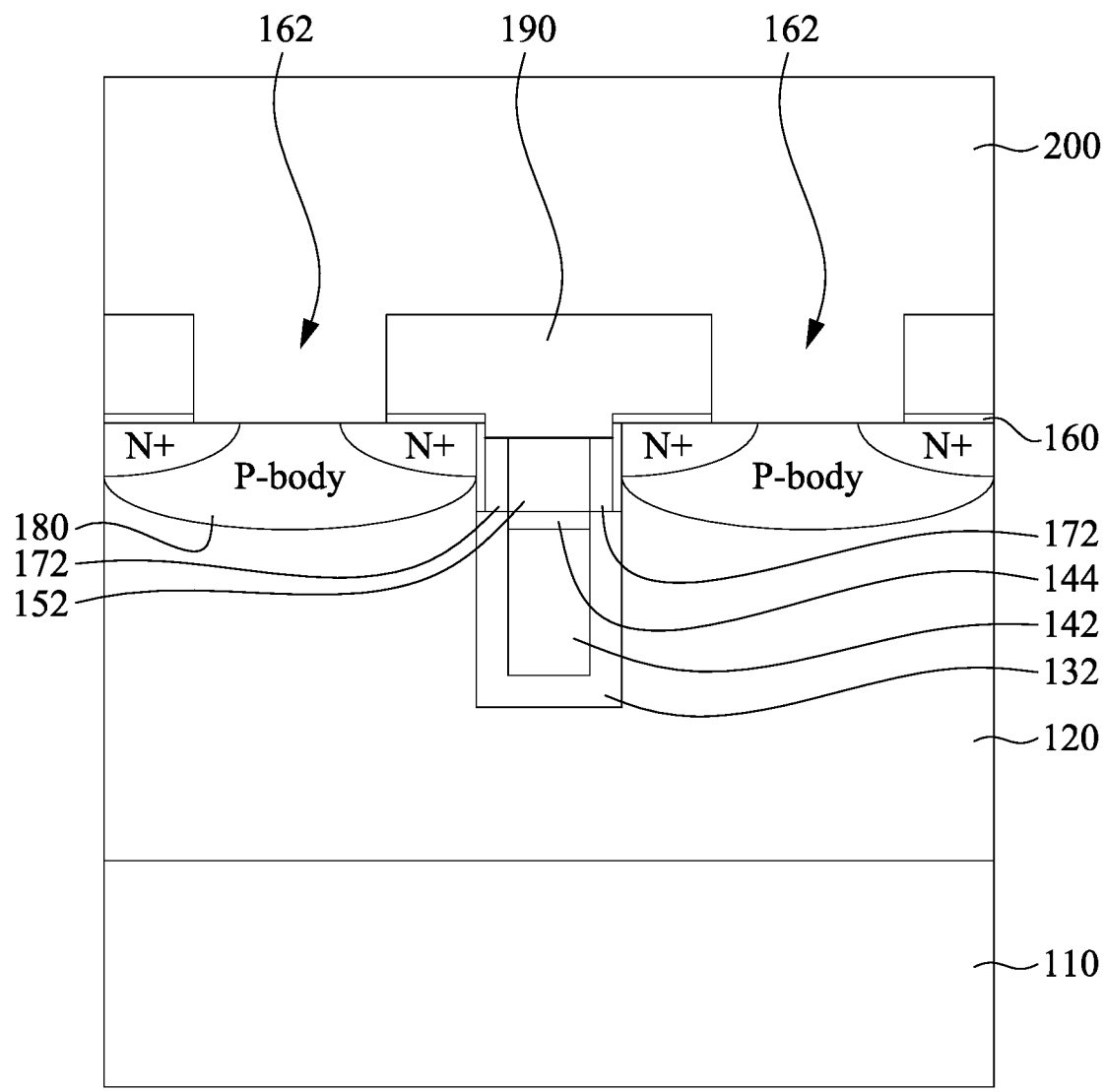

Referring to FIG. 8, as illustrated in the drawing, a second dielectric layer 190 is formed on the gate oxide layer 160 and the gate structure 210, and the second dielectric layer 190 and the gate oxide layer 160 are etched to form the required openings 162 with a contact mask. In addition, a metal layer 200 is deposited on the second dielectric layer 190 and in the openings 162, and the metal circuits are formed by etching with required mask. In some embodiments, the second dielectric layer 190 includes a borophospho-silicate glass (BPSG) as a dielectric layer and the thickness is about 6000 angstroms to 10000 angstroms. In addition, the metal layer 200 is an aluminum metal layer, and the thickness thereof is about 3.0 microns to 5.0 microns.

In some embodiments, the upper gate 172 of the gate structure 210 is formed between the intermediate insulating portion 152 and the gate oxide layer 160 so that the intermediate insulating portion 152 is located in the upper gate 172, and the lower gate 142 is enclosed by the first dielectric layer 132 and the second oxide layer 144.

Accordingly, the method of manufacturing a trench type semiconductor device can produce a power transistor, the volume of the upper gate is effectively reduced by the intermediate insulating portion, the upper gate is accurately formed between the intermediate insulating portion and the gate oxide layer, and the first dielectric layer and the second oxide layer are simultaneously utilized to enclose the lower gate. Therefore, the drain-source breakdown voltage (BVDSS) is effectively increased, the input capacitance (Ciss) and the reverse transfer capacitance (Crss) are reduced and the output capacitance (Coss) is increased to improve the gate capacitance characteristics, and increase the gate response speed.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A method of manufacturing a trench type semiconductor device, comprising:
    forming an epitaxial layer on a substrate;
    forming a trench in the epitaxial layer;
    forming a gate structure in the trench, wherein the gate structure comprises an upper gate, a lower gate and an intermediate insulating portion, and the intermediate insulating portion is located in the upper gate;
    depositing a first oxide layer in the trench;
    depositing a first polysilicon layer on the first oxide layer and in the trench;
    etching back the first polysilicon layer until lower than an upper surface of the first oxide layer;
    oxidizing a surface of the first polysilicon layer to form a second oxide layer, and enclosing the lower gate by the second oxide layer and the first oxide layer;
    depositing a silicon nitride layer in the trench;
    etching back the silicon nitride layer to form the intermediate insulating portion;
    etching back the first oxide layer to remove a portion of the first oxide layer to form a first dielectric layer and expose a partial surface of the epitaxial layer, and the first dielectric layer and the second oxide layer enclose the lower gate;
    oxidizing the partial surface of the epitaxial layer to form a gate oxide layer;
    depositing a second polysilicon layer to fill up the trench; and
    etching back the second polysilicon layer to expose the intermediate insulating portion.

2. The method of manufacturing a trench type semiconductor device of claim 1, wherein a thickness of the first oxide layer is about 5000 angstroms (Å) to 10000 angstroms, and a thickness of the first polysilicon layer is about 6000 angstroms to 10000 angstroms and fills up the trench.

3. The method of manufacturing a trench type semiconductor device of claim 2, further comprising:
    etching back the first polysilicon layer until lower than the upper surface of the first oxide layer about 1.5 microns to 2 microns.

4. The method of manufacturing a trench type semiconductor device of claim 3, further comprising:
    etching back the second polysilicon layer until lower than an upper surface of the gate oxide layer about 200 angstroms to 500 angstroms.

5. The method of manufacturing a trench type semiconductor device of claim 4, further comprising:
    implanting ions into the epitaxial layer and driving in the ions by heating; and
    utilizing a source mask to define a source region.

6. The method of manufacturing a trench type semiconductor device of claim 5, further comprising:
    forming a second dielectric layer on the gate oxide layer;
    etching the second dielectric layer and the gate oxide layer with a contact mask to form a plurality of openings; and
    depositing a metal layer on the second dielectric layer and in the openings.

* * * * *